United States Patent
Lai et al.

(10) Patent No.: US 8,866,565 B2
(45) Date of Patent: Oct. 21, 2014

(54) SYSTEMS AND METHODS FOR PROVIDING AN ELECTRIC CHOKE

(75) Inventors: Rixin Lai, Clifton Park, NY (US); Joseph Smolenski, Slingerlands, NY (US)

(73) Assignee: General Electric Company, Niskayuna, NY (US)

( * ) Notice: Subject to any disclaimer, the term of this patent is extended or adjusted under 35 U.S.C. 154(b) by 349 days.

(21) Appl. No.: 13/335,582

(22) Filed: Dec. 22, 2011

(65) Prior Publication Data

US 2013/0162370 A1    Jun. 27, 2013

(51) Int. Cl.
H03H 7/42    (2006.01)
H03H 7/09    (2006.01)

(52) U.S. Cl.
CPC ........ H03H 7/427 (2013.01); H03H 7/09 (2013.01)
USPC .......................................... 333/177; 333/172

(58) Field of Classification Search
USPC ........................................................ 333/177
See application file for complete search history.

(56) References Cited

U.S. PATENT DOCUMENTS

| | | | |
|---|---|---|---|
| 4,596,966 A * | 6/1986 | Derewonko et al. ............ | 331/68 |
| 5,661,390 A | 8/1997 | Lipo et al. | |
| 5,990,654 A | 11/1999 | Skibinski et al. | |
| 6,208,098 B1 | 3/2001 | Kume et al. | |
| 6,583,682 B1 | 6/2003 | Dubhashi et al. | |
| 7,116,076 B2 | 10/2006 | Sippola et al. | |
| 7,606,052 B2 | 10/2009 | Akagi | |
| 7,741,798 B2 | 6/2010 | Lucas | |
| 7,944,326 B2 | 5/2011 | Tucker | |
| 2010/0219902 A1 | 9/2010 | Schutten et al. | |
| 2011/0050135 A1 | 3/2011 | Higuchi et al. | |

OTHER PUBLICATIONS

A. Carrubba, M. Di Piazza, G. Tine, G. Vitale, Design and Experimental Implementation Issues for Common Mode Compensation Devices in PWM Induction Motor Drives, IEEE International Symposium on Industrial Electronics, Jun. 2007, pp. 588-593.*

* cited by examiner

*Primary Examiner* — Stephen Jones
*Assistant Examiner* — Scott S Outten
(74) *Attorney, Agent, or Firm* — Seema S. Katragadda

(57) ABSTRACT

Systems and methods for an electric choke are provided. The choke may be provided as part of a power transmission arrangement that includes a cable for electrically coupling a power source and a powered device having a ground node and a wire separate from the cable providing a path for a common-mode current through the ground node. The power transmission arrangement also includes an unbalanced choke coupled between the power source and the powered device, wherein a number of turns of the cable in the choke is different than a number of turns of the wire in the choke.

20 Claims, 3 Drawing Sheets

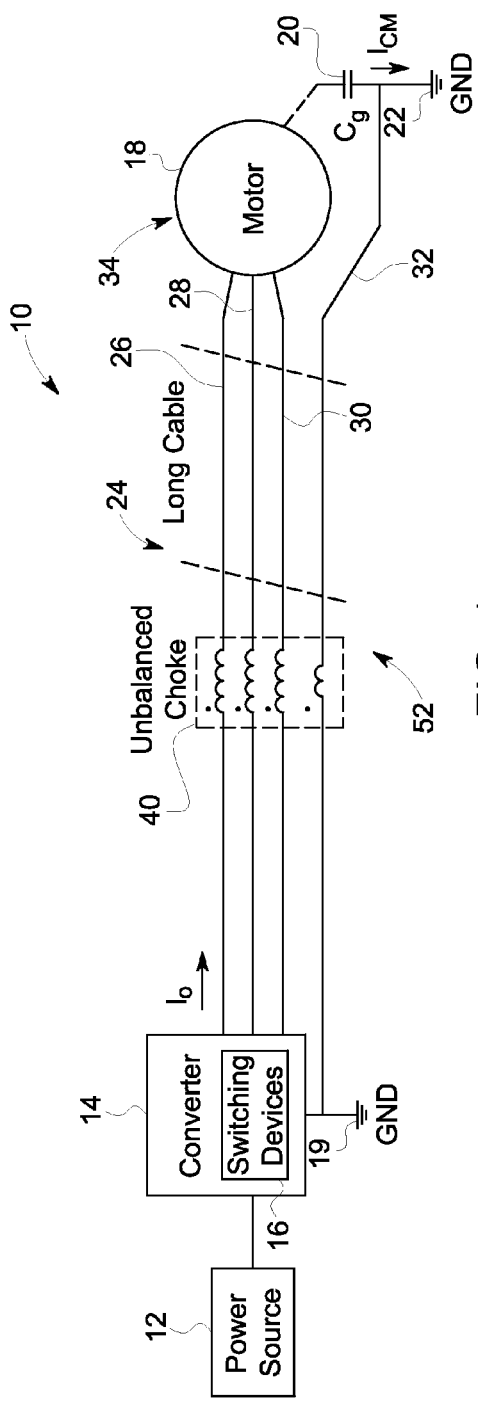
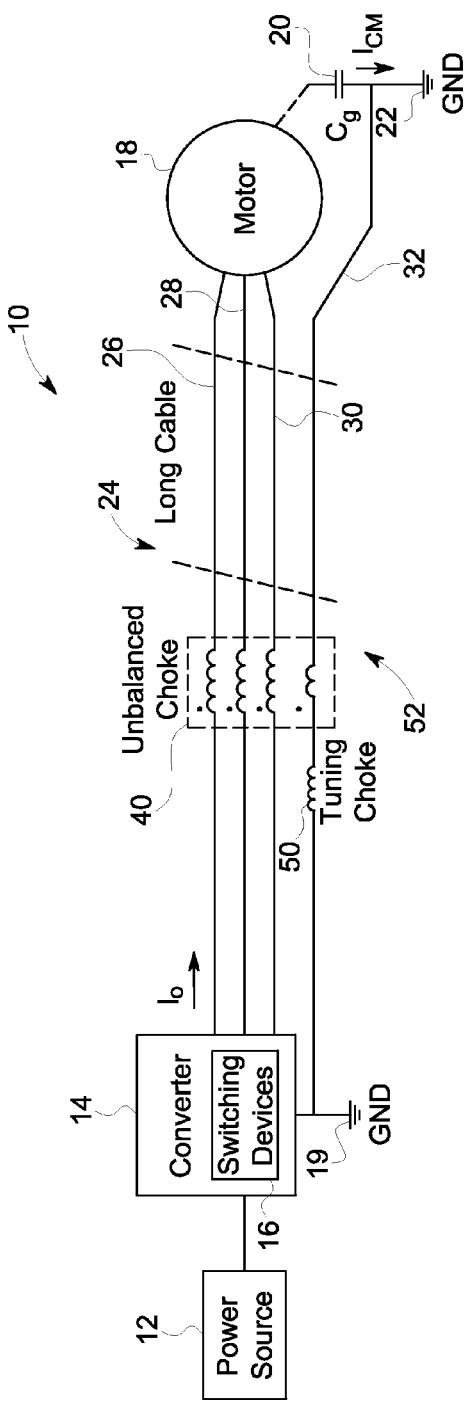
FIG. 1
FIG. 2

SYSTEMS AND METHODS FOR PROVIDING AN ELECTRIC CHOKE

BACKGROUND

Electromagnetic noise can interfere with the normal operation of electric devices or electric machines, which is commonly referred to as electromagnetic interference (EMI). When EMI is present, these electric devices may not operate reliably or efficiently.

In electric motors, a motor drive may be provided that includes a converter that switches power, such as high voltage power, on and off. The switching operation can result in EMI. For example, pulse width modulation (PWM) converters are commonly used in various applications due to the control performance and high efficiency characteristics of the PWM converters. However, the switching pattern of the power semiconductor devices in the converter induces a common-mode (CM) current which is coupled to the ground through the load parasitic capacitor. In some applications, an unshielded cable also may have to be used to connect the load and the converter. As a result, CM noise can be a significant issue because there is no longer a low impedance path to bypass the ground current.

Some known systems add additional wires and/or CM inductors into the cable bundle to achieve the desired CM noise filtering. However, these known arrangements often have to include large choke devices which increase the size, weight and cost of the system. Other known systems inject CM current onto the DC input side of the device. However, the CM current at the AC output of the device cannot be reduced. Still other known systems provide a controlled voltage source at the AC output to cancel the CM current. However, in these systems, additional active devices and a transformer in series with the main AC cable are required.

BRIEF DESCRIPTION

In one embodiment, a power transmission arrangement is provided that includes a cable for electrically coupling a power source and a powered device having a ground node and a wire separate from the cable providing a path for a common-mode current through the ground node. The power transmission arrangement also includes an unbalanced choke coupled between the power source and the powered device, wherein a number of turns of the cable in the choke is different than a number of turns of the wire in the choke.

In another embodiment, a power system is provided that includes a power source, a powered device having a ground node and a cable electrically coupling the power source and the powered device. The power system also includes a converter coupled between the power source and the powered device, wherein the converter has a ground node. The power system further includes a wire coupled between the ground node of the powered device and the ground node of the converter. The power system additionally includes a core coupled between the converter and the powered device having the cable and the wire wound around the core, wherein a number of turns of the wound cable is greater than a number of turns of the wound wire.

In yet another embodiment, a method of forming a choke is provided. The method includes winding a power transmission cable on a core and winding an additional wire on the core, wherein a number of turns of the additional wire is less than a number of turns of the power transmission cable. The method also includes configuring a wound arrangement of the power transmission cable and the additional wire on the core to provide power transmission having an alternate path for a returning common-mode current.

BRIEF DESCRIPTION OF THE DRAWINGS

FIG. 1 is a block diagram of a power system formed in accordance with an embodiment.

FIG. 2 is a block diagram of a power system formed in accordance with another embodiment.

DETAILED DESCRIPTION

Figure 3:
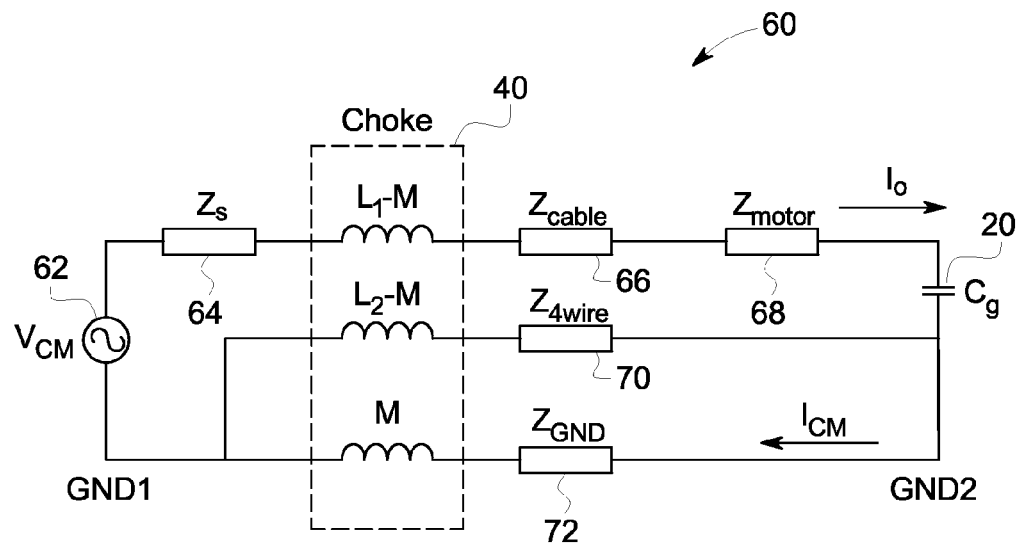
FIG. 3 is a diagram of a common-mode equivalent circuit for various embodiments.

The following detailed description of certain embodiments will be better understood when read in conjunction with the appended drawings. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property. As used herein, the term "conductor" is intended to mean a structure that conducts magnetic fields.

Various embodiments provide systems and methods for providing a choke, particularly for use with electric devices or machines. In particular, various embodiments provide a passive common-mode (CM) choke. By practicing various embodiments, at least one technical effect is that CM current may be reduced, resulting in CM noise reduction, thereby decreasing electromagnetic interference (EMI). By practicing various embodiments a smaller choke size also may be used.

In some embodiments, a CM choke is used such that a three-phase cable and an additional wire have a different number of turns. Another choke may also be added in the additional wire and the equivalent inductance of the additional wire can be reduced or minimized as described herein.

The various embodiments may be implemented within electric devices or machines, which may include electric motors and electric generators. For example, various embodiments may be used with different types of electric motors, such as permanent magnet motors or induction motors, among others. However, the unbalanced choke arrangement may be used in different types of motors having different component parts.

Applications of electric devices and machines include, but are not limited to, aerospace applications (e.g., aircraft applications), automotive applications, industrial applications, and/or the like. Embodiments of motor drives for the electric machines are also described herein, which include converters or invertors. However, the various embodiments may be implemented in connection with motor drives having different component parts. Thus, the various embodiments may be used with electric devices or machines, such as motors having different drive components with different designs, structures, configurations, arrangements, and/or the like.

FIGS. 1 and 2 are schematic block diagrams of different embodiments of a power system 10 having a converter supplying power to a load. In particular, and as illustrated, in one embodiment, the power system 10 includes a power source 12 (e.g., a DC power supply) connected to a converter 14. The converter 14 may form part of a motor control and may be any type of converter device. In one embodiment, the converter 14 is a pulse width modulation (PWM) converter. It should be noted that the converter 14 in some embodiments may be configured as an inverter that converts direct current (DC) to alternating current (AC). The converter 14 in the illustrated embodiment is a three-phase converter. It should be noted that the power source 12 may be two-phase or three-phase, and may be DC or AC depending on the structure of the converter 14.

The converter 14 may include one or more switching devices 16 that are configured in any suitable arrangement, such as based on the power requirements for the power system 10. The switching devices 16 may be any type of switching device, for example, a field-effect transistor (FET), a metal-oxide-semiconductor field-effect transistor (MOSFET) or an insulated gate bipolar transistor (IGBT), among others.

The converter 14 supplies a current, in particular a load current to a motor 18, which in one embodiment is an AC motor. However, the motor 18 may be of different types and have different configurations, for example, the motor 18 may be a DC motor.

In various embodiments the output of the converter 14 may include three phase AC voltage supplying a load current to the motor 18. The power system 10 includes a first ground 19 (e.g., a ground node (GRND1)) on the converter side and a second ground 22 (e.g., another ground node (GND2)) on the motor side coupled to a motor winding neutral point 33 through a parasitic capacitance 20. Thus, the motor 18 may generally include motor windings 34 coupled together at the neutral point 33, which is coupled to the ground 22 (e.g., a ground node), which may be through the parasitic capacitance 20. It should be noted that the node 19 may be, for example, the chassis of the converter 14.

In various embodiments, the converter 14 is coupled to the motor 18 via a cable 24, such as a power transmission cable, which in the illustrated embodiment is a three-phase output cable 24 including three wires 26, 28 and 30. In operation, a potential difference may exist between the first ground 19 and the second ground 22 due to a common-mode current that may flow between the grounds 19 and 22 via parasitic elements. In various embodiments, an additional wire 32 is coupled between the first and second grounds 19 and 22, which in this embodiment is a fourth wire, which provides an alternate path for a returning current, namely a common-mode current ($I_{CM}$). This additional wire 32 generally provides a low impedance path for the returning common-mode current.

Additionally, various embodiments include a choke 40 between the converter 14 and motor 18. The choke 40 in various embodiments includes coils of insulated wires wound around a magnetic core and is configured as an unbalanced choke. The coils of insulated wires generally provide line inductance, and as described in more detail herein, the choke 40 has a different number of wire turns for the wires 26, 28 and 30 (defining the main power cable, namely the three-phase output cable 24) than the additional wire 32 providing the alternate path for the $I_{CM}$. In particular, the number of turns for the wires 26, 28 and 30 of the three-phase output cable 24 is more than the number of turns for the wire 32. Accordingly, the number of turns within the choke 40 for all of the wires is not the same, thereby forming an unbalanced choke. Thus, an unbalanced impedance arrangement is provided.

The choke 40 generally forms a passive inductor to block certain frequencies, such as to block higher-frequency AC, while passing signals of lower frequency DC as described herein. In various embodiments, the choke 40 is a common-mode choke that passes differential currents (equal but opposite), while blocking common-mode currents $I_{CM}$.

It should be noted that variations and modification are contemplated. For example, an additional tuning choke 50 may be provided as shown in the embodiment of FIG. 2 to adjust the total inductance of the additional wire 32. The tuning choke 50, which is coupled between the choke 40 and the ground 19 to provide additional inductance, may further reduce CM current flowing into the ground 22, thereby reducing EMI.

In operation, the wire 32 having a lower number of turns within the choke 40 equivalently introduces a negative inductance which can cancel part or all of the stray inductance of the wire 32, and therefore provides a very low impedance bypass for the $I_{CM}$. Thus, a bypass loop is provided to reduce or minimize (and in some cases eliminate) the $I_{CM}$. In various embodiments, the choke 40 with the cable 24 and additional wire 32 form a power transmission arrangement 52.

FIG. 3 is a schematic diagram illustrating an equivalent circuit, namely a common-mode equivalent circuit 60 of the embodiment shown in FIG. 1. The common-mode equivalent circuit 60 illustrates a common-mode (CM) voltage source 62, which represents the CM voltage generated by the converter (namely the converter 14 in FIGS. 1 and 2) coupled through a source impedance 64 ($Z_s$), cable impedance 66 ($Z_{cable}$) and motor winding impedance 68 ($Z_{motor}$). The common-mode equivalent circuit 60 also illustrates an impedance 70 ($Z_{4wire}$) of the additional wire (namely the wire 32 shown in FIGS. 1 and 2) and a ground impedance 72 ($Z_{GND}$) which represents the ground impedance between grounds 19 (GND1) and 22 (GND2) shown in FIGS. 1 and 2. The common-mode current $I_{CM}$ may be defined as:

$$I_{CM} = I_0 \cdot \frac{Z_{4wire} + j\omega(L_2 - M)}{Z_{4wire} + Z_{GND} + j\omega L_2} \qquad \text{Eq. 1}$$

In Equation 1, ω is the frequency, M is the mutual inductance of the unbalanced choke and $L_2$ is the magnetizing inductance of the winding formed by the additional wire 32.

For a conventional balanced arrangement, where the additional wire 32 and the 3-phase wires 24, 26 and 28 have the same number of turns, namely $L_2$=M, ideally the effectiveness of the CM suppression depends on the choke inductance as follows:

$$I_{CM} = I_0 \cdot \frac{Z_{4wire}}{Z_{4wire} + Z_{GND} + j\omega L_2} \qquad \text{Eq. 2}$$

Accordingly, the CM noise current reduces as the choke inductance $L_2$ increase. However, the core size and/or number of turns of the choke are accordingly increased.

For the unbalanced choke 40, in various embodiments, with the additional wire 32 having less turns in the choke 40 than the 3-phase wires 26, 28 and 30. Accordingly, $L_2$−M, which is the inductance being added to the additional wire 32 by the unbalanced choke 40 is negative. Since the impedance of the additional wire 32 is mainly inductive (which means $Z_{4wire} \approx J\omega L_{4wire}$) the overall value of the numerator in Equation 1 will be reduced. It should be noted that the ideal case is $L_2 - M + L_{4wire} = 0$, which leads to zero CM current. It also should be noted that $L_{4wire}$ is the stray inductance of the additional wire 32.

Accordingly, in various embodiments, good or improved CM attenuation with a smaller inductance may be provided when the inductance follows the above mentioned relationship.

In various embodiments, the number of turns in the choke 40 for the wires 26, 28, 30 and 32 may be determined as described below. In particular, the number of turns (N) may be determined or optimized in one embodiment (although not limiting) using the following equation:

$$-L_{4wire} = L_2 - M = \frac{N_2(N_2 - N_1)}{R} \qquad \text{Eq. 3}$$

In the above Equation 3, $N_1$ is a number of turns for each of the 3-phase wires 26, 28 and 30, $N_2$ is a number of turns for the additional wire 32, and R is a reluctance of a core of the unbalanced choke.

Thus, the number of turns can be determined and/or tuned to achieve a desired negative inductance using Equation 3, which may also include changing the core parameters. For example, different core materials or a different core size for the choke 40 may be used. Variations and modification are also contemplated, for example, using a gapped core, where the reluctance R is adjusted by changing the air gap. In addition, the tuning choke 50 may be added as indicated in FIG. 2 to further adjust the total inductance of the additional wire 32 to be close to zero.

Figure 4:
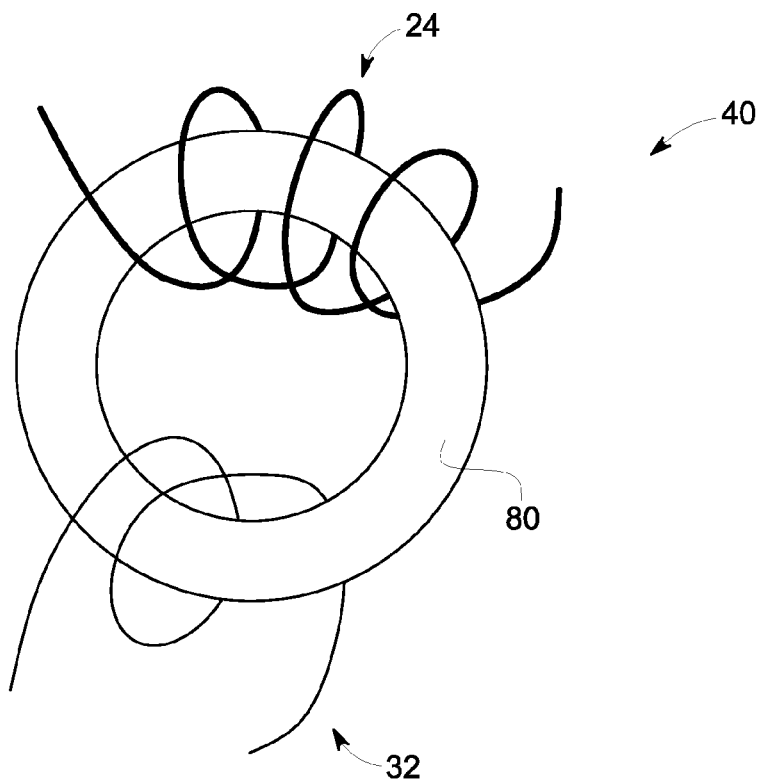
FIG. 4 is a diagram illustrating an unbalanced choke in accordance with an embodiment.

The choke 40 in various embodiments may be provided as shown in FIG. 4 generally illustrating coils of insulated wires wound around a core 80. As can be seen, the number of turns ($N_1$) of the three-phase cable 24 is greater than the number of turns ($N_2$) of the additional wire 32. It should be noted that the three-phase cable 24 represents the three-phase wires 26, 28 and 30 in the illustrated embodiment, and it may represent other number of wires depending, for example, on the system setup. It also should be noted that although $N_1=3$ and $N_2=1$ in the illustrated embodiment, different numbers of turns may be provided. Accordingly, the choke 40 is an unbalanced choke, where $N_1 \neq N_2$. The choke 40 in various embodiments, thus, provides a passive arrangement.

It should be noted that the core 80 may be formed from a magnetic material, such as iron powder or a ferrite material, or may be formed from a non-magnetic material. The core 80 may also have different shapes and the toroid shape shown with the windings wound around the ring portion of the toroid is for illustration only. For example, the core 80 may be a cylindrical shape (e.g., a solid cylindrical core material) with the wires wound around the outside surface of the cylinder. It also should be noted that different winding patterns may be provided as desired or needed.

Figure 5:
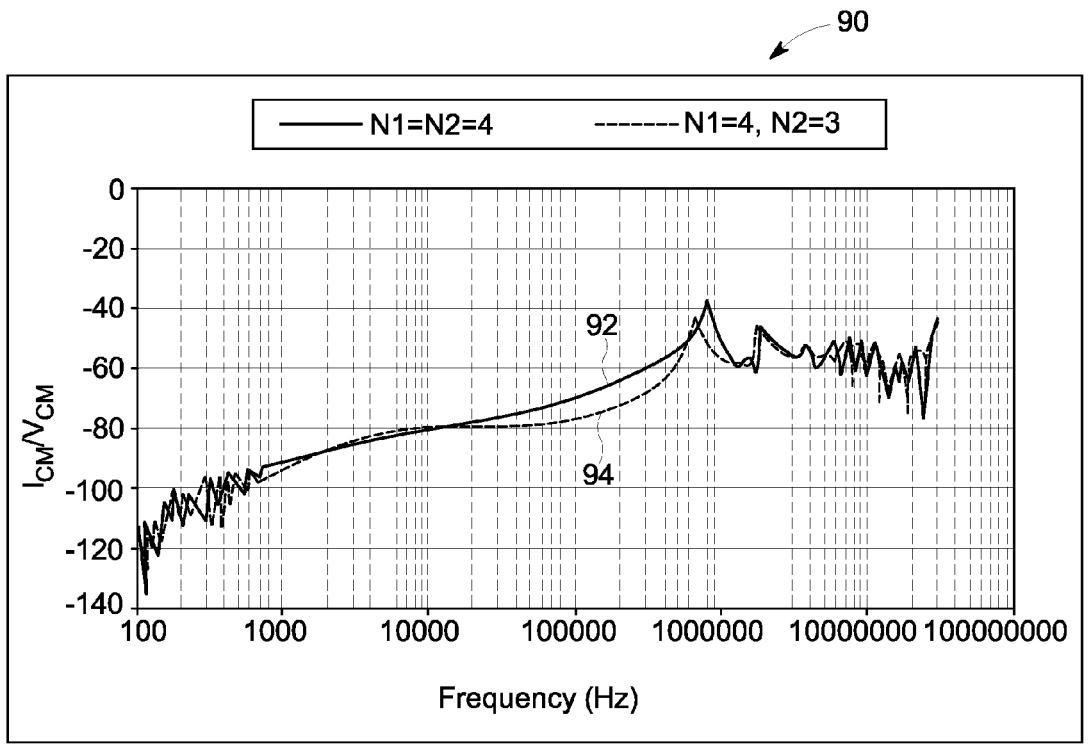
FIG. 5 is a graph illustrating a frequency response for a system having a balanced choke and a system having an unbalanced choke in accordance with various embodiments.

FIG. 5 is a graph 90 illustrating a frequency response plot having an x-axis representing frequency in Hertz (Hz) and a y-axis representing $I_{CM}/V_{CM}$ measured in decibels (dB). $I_{CM}/V_{CM}$ indicates the attenuation of the CM noise. The frequency response is measured for an exemplary embodiment wherein instead of the converter 14, a high frequency voltage source $V_{CM}$ is configured to inject CM noise.

In the graph 90, the frequency response profile illustrated by the curve 92 is for a balanced choke and the frequency response profile illustrated by the curve 94 is for an unbalanced choke, such as the choke 40. In both cases, the same magnetic core is used. In the illustrated graph 90, for the curve 92, $N_1 = N_2 = 4$ and for the curve 94 $N_1 = 4$ and $N_2 = 3$. As can be seen in the graph 90, in the mid frequency range, additional 10 dB attenuation is achieved by adjusting the turns ratio, accordingly an unbalanced choke. Thus, in various embodiments, increased CM noise reduction (namely improved CM attenuation) with less turns and/or a smaller core for the choke may be provided.

It should be noted that various embodiments may be applied, for example, to any converter system having the wire structure of the main power cable plus a shielding wire.

Figure 6:
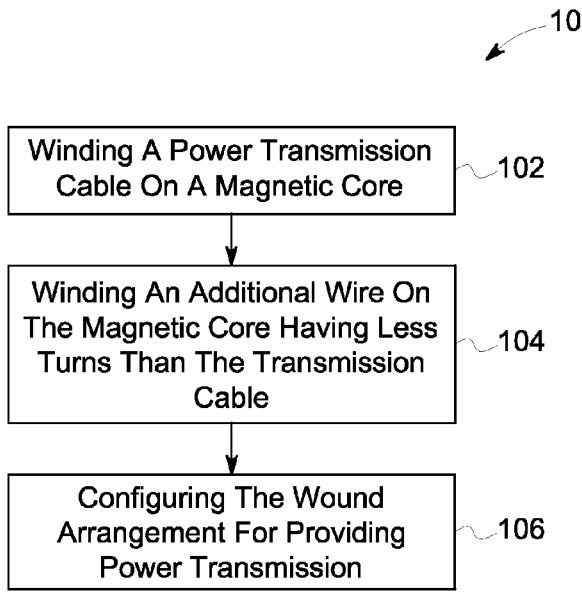
FIG. 6 is a flowchart of a method for forming a choke in accordance with various embodiments.

Various embodiments also provide a method 100 as shown in FIG. 6 for forming a choke. The choke may be embodied, for example, as the choke 40 and used as part of a power transmission arrangement. The method 100 includes winding a power transmission cable on a core at 102. For example, in some embodiments, the power transmission cable is a three-phase cable that is wound around an iron powder or ferrite core. It should be noted that the core may be a magnetic core or a non-magnetic, based on, for example, the frequency of operation for the choke. Additionally, the material and size of the core may be varied as desired or needed, such as to achieve the desired inductance as described herein.

The method 100 also includes winding an additional wire on the core at 104. The additional wire is also coupled between the ground node at the converter side and the ground node at the load side. The number of winding or turns of the additional wire on the core is less than the number of windings or turns of the power transmission cable as described in more detail herein. It should be noted that different winding configurations may be provided, for example, a simple toroidal or circular pattern, or more complex patterns, such as a basket winding.

The method 100 additionally includes configuring the wound arrangement, which in various embodiments forms a choke, to provide power transmission having an alternate path for the common mode current. For example, the ends of the power transmission cable and/or wire may be provided with suitable connectors, such as to connect to a power source and a powered device, which may be any type of load (e.g., a motor). Thus, the configuring provides an alternate path for a returning common-mode current.

It should be noted that the steps of the method 100 may be performed in any order and some of the steps may be performed simultaneously or concurrently instead of sequentially.

Thus, various embodiments provide an unbalanced choke that reduces or minimizes the impedance of the additional wire to provide a CM current bypass. In various embodiments, a negative inductance is generated in the additional wire by using an unbalanced winding structure. With different arrangements, which may include adding a tuning choke, and using different turns ratio or core structure, the inductance of the additional wire may be reduced or minimized as described herein. Accordingly, in various embodiments, the additional wire acts like an ideal shielding and the CM current through the ground can be further reduced.

In operation, the various embodiments can reduce the CM current in the ground network between the converter (or other noise source) and the load. Thus, in various embodiments, the size and weight of the output CM choke can be reduced. Accordingly, performance changes (namely improved performance) of the CM choke may be provided by changing the number of turns of the additional wire and/or adding a small tuning choke.

In some applications, such as in aviation applications, the various embodiments may provide an output choke and cable shielding having reduced size and weight to comply with weight and size density requirements. For example, the choke may be used in a switching converter system within an aircraft.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from the scope of the various embodiments. While the dimensions and types of materials described herein are intended to define the parameters of the various embodiments, the embodiments are by no means limiting and are exemplary embodiments. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A power transmission arrangement comprising:
   a cable for electrically coupling a power source and a powered device having a ground node;
   a wire separate from the cable providing a path for a common-mode current through the ground node; and
   an unbalanced choke coupled between the power source and the powered device, wherein a number of turns of the cable in the choke is different than a number of turns of the wire in the choke, and wherein the number of turns of the wire in the choke is based on a stray inductance of the wire.

2. The power transmission arrangement of claim 1, further comprising a converter coupled between the power source and the powered device, and wherein the powered device is a motor.

3. The power transmission arrangement of claim 2, wherein the converter comprises at least one switching device.

4. The power transmission arrangement of claim 2, wherein the converter is a switching converter and the power source is an aircraft power supply.

5. The power transmission arrangement of claim 1, wherein the number of turns of the cable is greater than the number of turns of the wire.

6. The power transmission arrangement of claim 1, further comprising another ground node on an input side of the power source.

7. The power transmission arrangement of claim 1, further comprising a tuning choke connected through the ground node, the tuning choke separate from the unbalanced choke.

8. The power transmission arrangement of claim 1, wherein the number of turns of the cable and the number of turns of the wire are defined by:

$$-L_{4wire} = \frac{N_2(N_2 - N_1)}{R}$$

where $L_{4wire}$ is the stray inductance of the wire, $N_1$ is the number of turns of the cable, $N_2$ is the number of turns of the wire, and R is a reluctance of a core of the unbalanced choke.

9. The power transmission arrangement of claim 1, wherein the power source comprises a three-phase power supply and the cable is a three-phase cable having three wires with the same number of turns in the unbalanced choke.

10. A power system comprising:
    a power source;
    a powered device having a ground node;
    a cable electrically coupling the power source and the powered device;
    a converter coupled between the power source and the powered device, the converter having a ground node;
    a wire coupled between the ground node of the powered device and the ground node of the converter; and
    a core coupled between the converter and the powered device and having the cable and the wire wound around the core, wherein a number of turns of the wound cable is greater than a number of turns of the wound wire, and wherein the number of turns of the wound wire is based on a stray inductance of the wire.

11. The power system of claim 10, further comprising a tuning choke connected between the ground node of the powered device and the ground node of the converter.

12. The power system of claim 10, wherein the number of turns of the cable and the number of turns of the wound wire are defined by:

$$-L_{4wire} = \frac{N_2(N_2 - N_1)}{R}$$

where $L_{4wire}$ is the stray inductance of the wire, $N_1$ is the number of turns of the wound cable, $N_2$ is the number of turns of the wound wire, and R is a reluctance of the core.

13. The power system of claim 10, wherein the powered device is a motor and the core comprises one of an iron powder or a ferrite material.

14. The power system of claim 10, wherein the converter comprises at least one switching device.

15. The power system of claim 10, wherein the converter is a switching converter.

16. A method of forming a choke, the method comprising:
    winding a power transmission cable on a core;

winding an additional wire on the core, wherein a number of turns of the additional wire is less than a number of turns of the power transmission cable, and wherein the number of turns of the additional wire is based on a stray inductance of the additional wire; and configuring a wound arrangement of the power transmission cable and the additional wire on the core to provide power transmission having an alternate path for a returning common-mode current.

17. The method of claim 16, wherein the power transmission cable is a three-phase power cable and the core is a magnetic core.

18. The method of claim 16, further comprising coupling a tuning choke to the additional wire.

19. The method of claim 16, wherein the number of turns for the power transmission cable and the number of turns for the additional wire are determined by:

$$L_{4wire} = -\frac{N_2(N_2 - N_1)}{R}$$

where $L_{4wire}$ is the stray inductance of the additional wire, $N_1$ is the number of turns of the cable, $N_2$ is the number of turns of the wire, and R is a reluctance of the core.

20. The method of claim 16, wherein the power transmission cable is configured to be coupled to a converter that comprises at least one switching device.

* * * * *